United States Patent
Knight

(10) Patent No.: US 7,298,602 B2
(45) Date of Patent: Nov. 20, 2007

(54) AUTOMATED SUPERCONDUCTING MAGNET RAMP-UP SYSTEM AND METHOD

(75) Inventor: Larry Keith Knight, Sand Springs, OK (US)

(73) Assignee: GE Medical System, Inc., Milwaukee, WI (US)

( * ) Notice: Subject to any disclaimer, the term of this patent is extended or adjusted under 35 U.S.C. 154(b) by 586 days.

(21) Appl. No.: 10/723,856

(22) Filed: Nov. 26, 2003

(65) Prior Publication Data

US 2005/0111159 A1    May 26, 2005

(51) Int. Cl.
*H01H 47/00*        (2006.01)
(52) U.S. Cl. ....................................... 361/141
(58) Field of Classification Search .................. 361/141
See application file for complete search history.

(56) References Cited

U.S. PATENT DOCUMENTS 5,323,776 A * 6/1994 Blakeley et al. ............ 600/324
6,858,265 B2 * 2/2005 Redeker et al. ............. 427/569

* cited by examiner

*Primary Examiner*—Michael Sherry
*Assistant Examiner*—Dharti H Patel
(74) *Attorney, Agent, or Firm*—Fletcher Yoder

(57) ABSTRACT

The present invention provides for a novel technique for placing superconducting magnets into operation. For example, the technique provides for automatically controlling ramp-up of a superconducting magnet. In one aspect, the technique includes connecting a power supply to the magnet, determining constraining parameters of the ramp-up, automatically applying power to the magnet, automatically controlling the ramp-up based on the constraining parameters, and wherein the ramp-up is complete upon reaching a predetermined value of a target parameter.

49 Claims, 5 Drawing Sheets

AUTOMATED SUPERCONDUCTING MAGNET RAMP-UP SYSTEM AND METHOD

The present technique relates to medical imaging devices and other systems employing superconducting magnet systems. More particularly, the invention relates to a technique for bringing a superconducting magnet into operation in an automated fashion following installation or servicing.

A number of important applications exist for superconductive magnet systems. These include imaging systems, as for medical imaging, as well as spectrometry systems, typically used in materials analysis and scientific research applications. The present technique relates to management of cryogenically cooled superconductive magnets, and particularly to the monitoring and servicing of such systems. Although reference is made throughout the following discussion to imaging systems, it should be borne in mind that the technique is applicable to a range of systems that utilize cryogenically cooled superconducting magnets.

Imaging devices are omnipresent in typical medical environments. Medical practitioners, such as physicians, may employ medical imaging devices to diagnose patients. Imaging devices, such as Magnet Resonance Imaging (MRI) devices and Nuclear Magnetic Resonance (NMR) devices, produce detailed images of a patient's internal tissues and organs, thereby mitigating the need for invasive exploratory procedures and providing valuable tools for identifying and diagnosing disease and for verifying wellness.

Typical MRI and NMR devices develop diagnostic images by affecting gyro-magnetic materials within a patient via controlled gradient magnetic fields and radiofrequency pulses in the presence of a main magnetic field developed by a superconductive magnet. During an MRI exam, a main magnetic field of upwards of two Tesla may be necessary to produce vivid images. Typically, superconductive electromagnets comprise loops of coiled wire, which are continuously bathed in a cryogen, such as liquid helium, at temperatures near absolute zero—e.g., −269° C. or 4 K. When cooled to such extreme temperatures, the coiled wire becomes superconductive, i.e., the electrical resistance of the wire falls to essentially zero, enhancing the field strength without requiring significant energy input for continued operation. Accordingly, as long as the superconductive temperatures are maintained, an electrical current, such as 55 amperes, may "circulate" through the magnet coils, maintaining the magnetic field without requiring additional energy input. Advantageously, superconductive electromagnets reduce the electrical load requirements for producing the desired magnetic fields, thereby making the MRI system more economical to operate.

Cryogenic liquids, such as liquid helium, however, are relatively expensive to produce and maintain. Moreover, because of its low boiling point, liquid helium is a volatile liquid that transitions into a gaseous phase at relatively low temperatures. Accordingly, to conserve helium, typical MRI devices include a cryogen condensing system, which recondenses volatilized helium back into its liquid phase. That is, the helium is maintained in a sealed helium vessel that provides gaseous helium to the condensing system and receives liquid helium from the condensing system in a closed loop process. Additionally, because of the significant difference between the superconducting temperature and ambient temperature, a considerable driving force exists for heat transfer from the environment into the magnet system. Accordingly, thermal insulating material and other heat transfer barriers, such as vacuum regions and radiation shields, may insulate the magnet and cryogen to impede heat transfer from the environment. For environmental heat effects that reach the inner workings of the magnet system, the liquid pool of cryogen that surrounds the magnet may absorb the heat to maintain the magnet at desired temperature. Cryogens operating at or near their boiling points typically expend this external heat by vaporizing relatively small amounts of cryogen.

Recondensing magnet systems, from time to time, require maintenance, for example, when the cryogen condensing system may require repair or replacement. In particular, the performance of the condensing system components may degrade, thereby reducing the efficacy of the condensing system and overall magnet cooling system (cryogenic cooling system). Moreover, leaks within the cryogen (helium) vessel and/or condensing system, again for example, may also reduce the efficacy of the cooling system. During maintenance, it may become necessary to disengage the condensing system, cooling system, and/or deactivate the MRI devices, events that are to be avoided. If the cryogen condensing system is off-line or not condensing effectively, more of the liquid cryogen may begin to volatilize, leading to an increase of pressure in the cryogen vessel (i.e., cryostat). To prevent adverse effects due to the increased pressure, traditional MRI devices, such as a relief valve installed, for example, on the cryogen vessel may relieve pressure by venting some of the gaseous cryogen to the atmosphere. This conversion of liquid cryogen, such as liquid helium, to its gaseous state, and/or the subsequent venting of the gas, is generally known in the industry as "boil-off." Venting of the gas leads to permanent loss of expensive cryogen, requiring periodic refilling of the system.

Deactivation of the magnet system may also cause other problems. For example, deactivation may require a subsequent start-up of the magnet system, including a "ramp-up" or "ramping" of the magnet, where current must be slowly added to the magnet to regain the magnet field strength. These ramps are often problematic and manually intensive, consuming time and creating risk of damage to the magnet system.

Traditionally, the maintenance of cooling systems in MRI devices is a reactive process. That is, technicians are generally called when, for example, image quality has been affected, a critical indicator has activated, and/or the system is no longer operable. For example, a typical system may generate a service call when a low level of cryogen is detected due to venting or leaks in the system. In addressing concerns reactively, the repair time and/or off-line periods may be longer than desired. For example, certain parts and/or technicians may not be immediately available, leading to longer than necessary downtimes (i.e., off-line time). Moreover, periods of reactive maintenance may not coincide with already scheduled routine maintenance procedures, leading to duplicative downtimes for the MRI device. Similarly, when substantial quantities of cryogen are required, very significant costs may be incurred in refilling the serviced system. And typically, the time associated with problematic ramping (start-up) of the magnet impacts the cost of servicing the magnet, as well as, adds to MRI downtime, events that are to be avoided.

Similar problems exist even prior to the time such magnets are placed in operation, as well as at initial start-up. Magnets are typically built and tested in a controlled factory environment, then at least partially disassembled from other support equipment for shipping. Current procedures for building, testing and shipping superconductive magnets do not, however, adequately accommodate boil-off, servicing needs, and ramping consistency. Ramping generally includes the process of charging the magnet coils with a desired current needed for operation. However, because the coils essentially present no resistance to current flow, the current must be added in a controlled manner to avoid having the current run away (i.e. having the magnet draw too much current). This carefully controlled process is commonly referred to as "ramping up" due to the fact that current is gradually added to the magnet at controlled rates in a ramp-type fashion.

In general, for start-up of the magnet system (e.g., during testing, at the initial installation, or after magnet system downtime), the magnet current may be ramped, for example, to a target magnet current or target field strength or frequency. The ramp generally requires care to avoid overheating the magnet or otherwise damaging the magnet. If the magnet temperature increases excessively, the ramp rate may not be recoverable, but instead the magnet current discharged, and the ramp started over. Problematic ramping of superconducting magnets increases MRI downtime and costs. The desire to avoid damaging the magnet generally results in relatively long ramp times. Moreover, it is not uncommon for the service technician or field engineer to overshoot or undershoot the desired magnet current or field strength.

Overshooting of the target magnet current may require draining or ramp-down of the magnet current and reinitiating the ramp-up process. Furthermore, overshooting of the target and/or an excessive ramp rate (e.g., greater than 4 amperes/minute) can cause equipment damage in the superconducting magnet system. For example, the magnet leads may overheat and fail, and potentially damage the magnets. Also, the magnet itself may generate significant heat, resulting in the undesirable boil-off of cryogen. And as will be appreciated by those skilled in the art, a phenomenon of quenching may occur, in which a localized portion of the magnet increases in temperature and loses superconductivity. This localized increase in temperature may propagate throughout the magnet, damaging the magnet. Thus, for the aforementioned reasons, a field engineer may typically err on the side of undershooting the target magnet current. Unfortunately, however, a conservative ramp-up results in longer ramp times. In general, problems with the ramp-up of the superconducting magnet system can cause equipment damage, venting of helium, increased downtime (and start-up time), increased maintenance costs, and so forth. Thus, problematic magnet ramping techniques increase the cost of operating and maintaining an MRI system and decrease the availability of the MRI system.

Accordingly, there is a need for a technique that reduces MRI periods of deactivation, costs, and so forth. Particularly, there is a need to reduce the time required for ramp-up of the superconducting magnet and to improve the ability of ramp-up techniques to consistently achieve the magnet target current without adverse effects, such as equipment damage or helium loss.

BRIEF DESCRIPTION OF THE INVENTION

The present invention provides for a novel technique for placing superconducting magnets into operation designed to respond to such needs. For example, the technique provides for automatically controlling ramp-up of a superconducting magnet. In one aspect, the technique includes connecting a power supply to the magnet, determining constraining parameters of the ramp-up, automatically applying power to the magnet, automatically controlling the ramp-up based on the constraining parameters, and wherein the ramp-up is complete upon reaching a predetermined value of a target parameter.

The technique may provide for automatically controlling a rate of supply current to the magnet based on several constraining target parameters. The target parameter may include magnet frequency or field strength, as well as magnet current and magnet temperature. Operating values of the constraining parameters may be measured and compared to set points of the constraining parameters to control the rate of supply current. The technique may include measuring magnet temperature, magnet frequency, and magnet field strength, and magnet current.

The constraining parameters may include magnet current during a first phase of the ramp-up and include magnet frequency or field strength during a second phase of the ramp-up. Additionally, the constraining parameters during the first phase and second phase may include magnet temperature. The magnet temperature may include magnet coil temperature, cryogen temperature, or radiation shield temperature. In one embodiment, the magnet temperature is kept below 7 K, the total increase in magnet temperature over the ramp is controlled at less than +2 K, and the rate of supply current is controlled in the range of 0 to 4 amperes per minute.

A switching point may specify when constraining parameters change between the first phase and second phase. In one example, the switching point is based on magnet current, and is in the range of 35-40 amperes generally corresponding to reaching stable readings on a Tesla meter that measures magnet frequency or field strength. Also, a value of the target parameter may be a magnet frequency of 15.0002 MHz or 0.35 Tesla, generally corresponding to a magnet current in the range of 53-57 amperes.

DETAILED DESCRIPTION OF SPECIFIC EMBODIMENTS

Figure 1:
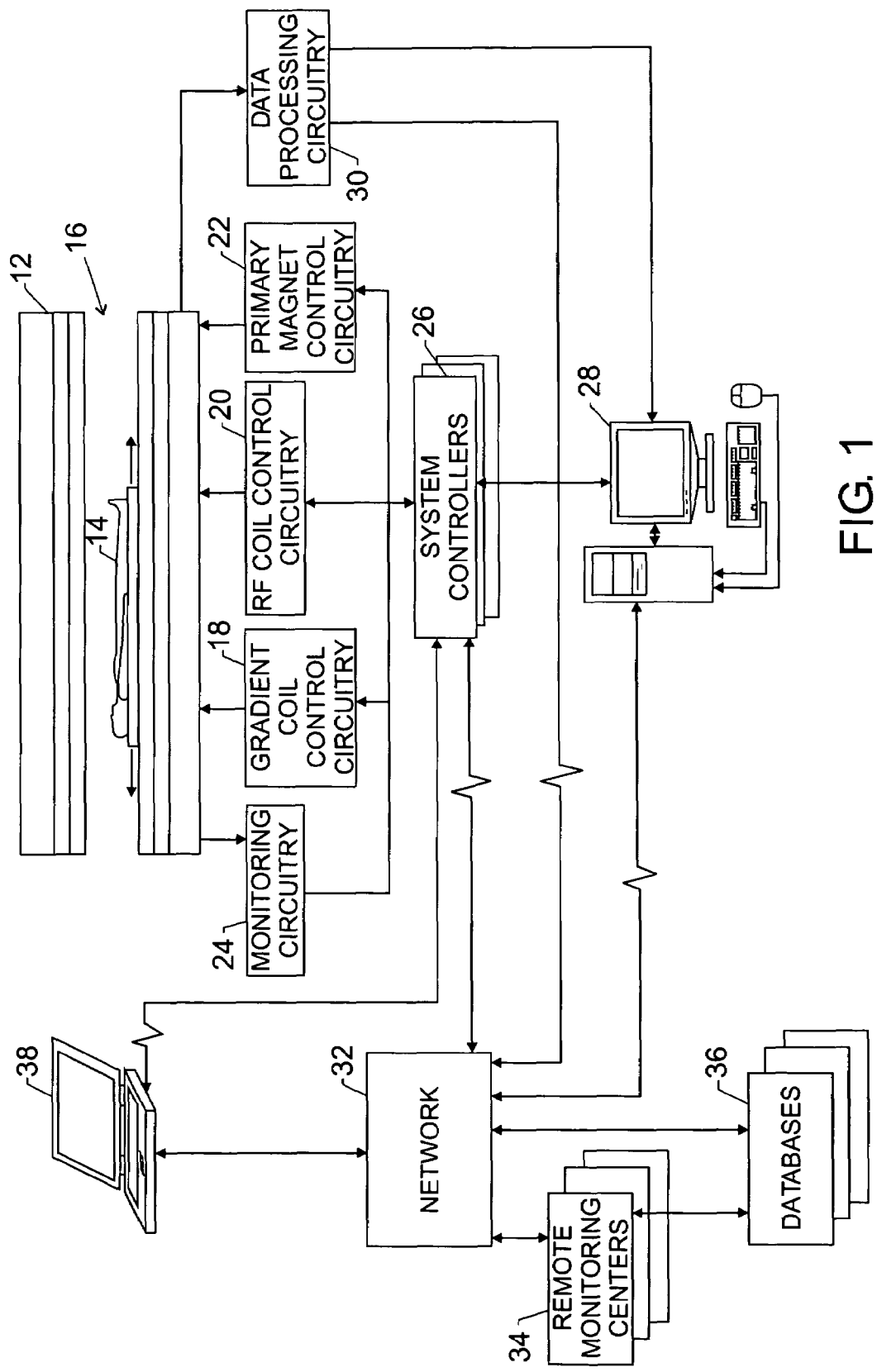
FIG. 1 is a diagrammatical representation of an exemplary imaging network employing a superconducting magnet that is brought into operation in accordance with the present technique.

Turning to the drawings, FIG. 1 illustrates an exemplary imaging network 10. Although described with respect to a medical imaging device, it should be note that the present technique may be applied to any number of systems or devices that employ a cryogen for cooling, such as spectroscopy systems, nuclear accelerators, biological cooling facilities, and power transmission systems, to name but a few. The exemplary imaging network 10 includes a magnetic resonance imaging MRI scanner 12.

To obtain diagnostic images of a patient 14, a medical professional may direct the patient 14 into a patient bore 16 of the MRI scanner 12. A main magnetic field (i.e., 0.5-2.0 Tesla) is generally present in the patient bore 16. This field, as discussed further below, is produced by a superconductive electromagnet (see FIG. 2) disposed circumferentially about the patient bore 16. The superconductive electromagnet is maintained at superconducting temperatures (e.g., 1-5 degrees Kelvin) to reduce the electrical resistance in the magnet coils to substantially zero. Advantageously, the superconductive nature of the electromagnet reduces the electrical requirements for producing the magnetic field, thereby making the MRI scanner 12 more economical to operate. It should be noted that, while in the present description reference is made to a horizontal cylindrical bore imaging system employing a super conducting primary field magnet assembly, as discussed below, the present technique may be applied to various other configurations, such as scanners employing vertical fields generated by super conducting magnets, permanent magnets, electromagnets or combinations of these means. Additionally, to manipulate the main magnetic field and to obtain diagnostic images, the MRI scanner 12 includes gradient magnets or coils, and radio frequency (RF) coils (not shown), both of which may be of generally known construction.

Operation of the MRI scanner 12 may be controlled and/or monitored by any number of control and monitoring circuits. By way of example, the gradient coils, the rf coils, and the main magnet may be controlled by gradient coil control circuitry 18, rf coil control circuitry 20, and main magnet control circuitry 22, respectively. Moreover, as discussed further below, various operations and conditions of the MRI scanner 12 may be monitored by monitoring circuitry 24.

Certain of these control and monitoring circuits may function under the direction of one or more system controllers 26, such as the heater controller and cooling system controller discussed further below. The system controller may include any suitable programmable logic device, such as a CPU or a digital signal processor of a general purpose or application. The system controller also may include memory circuitry, such as volatile and non-volatile memory devices, for storing physical and logical axis configuration parameters, examination pulse sequence descriptions, acquired image data, programming routines, and so forth, used during the examination sequences implemented by the scanner. Advantageously, the system controllers 26 may permit some amount of adaptation or configuration of the examination sequence by means of an operator interface 28. The operator interface 28 may be a computer terminal that provides a graphical user interface (GUI) to an individual for the receipt of information from and the input of commands to the MRI scanner 12.

Additionally, the exemplary MRI scanner 12 is coupled to data processing circuitry 30, which receives the detected imaging signals and processes the signals to obtain data for image reconstruction. In the exemplary MRI scanner 12, the data processing circuitry 30 digitizes the received signals and performs a two-dimensional fast Fourier transform on the signals to decode specific locations in the selected slice from which the received signals originated, thereby producing image data representative of the patient's internal tissue and organs, or more generally, features of interest of a subject. The resulting image data may be forwarded to the operator interface 28 for viewing. The image data may also be sent to a remote data repository for storage, as discussed further below. Advantageously, the data processing circuitry 30 may perform a wide range of other functions, such as image enhancement, dynamic range adjustment, intensity adjustment, smoothing, sharpening, and so forth. However, it should be appreciated that such functions may also be performed by software and/or hardware included in the operator interface 28 as well as at remote locations, which are discussed further below.

In many instances, the MRI scanner 12 may communicate with remote locations and devices via a network 32, such as a Local Area Network (LAN), a Server Area Network (SAN), a Metropolitan Area Network (MAN), a Wide Area Network (WAN), a Virtual Private Network (VPN), the Internet, or any other suitable kind of network. Communications over the network 32 may be conducted via any number of communications schemes and protocols, such as Global Standard for Mobile (GSM), Time Division for Multiple Access (TDMA), Code Division Multiple Access (CDMA), Frequency Division Multiple Access (FDMA), radio frequencies (rf), or any other suitable communications techniques. By way of example, the imaging network 10 may include remote monitoring centers 34, which may receive operation data and imaging data from the MRI scanner 12 via the network 32. Advantageously, the remote monitoring centers 34, via the network 32, may improve the image data quality as well as monitor and adjust the operating parameters remotely.

The network 32 may also facilitate access to remote databases 36. Advantageously, the remote databases 36 may store large volumes of image data and operating data from a wide variety of sources coupled to the network. That is, data from multiple MRI scanners 12 and patients 14 may be stored in a central location. Indeed, image or operating data may be accessed by user interfaces 28 at locations remote from the imaging scanner 12.

In certain instances, a field technician may wish to access data or operating parameters from the MRI scanner 12. Accordingly, a field unit 38, such as a laptop computer or hand-held device, may be linked to the system controllers 26. To improve portability, the field unit 38 may be configured to communicate with the system controllers 26 via a wireless protocol, such as IEEE 802.11(b), Bluetooth, or rf communications. Advantageously, the field technician, via the field unit 38, may be able to monitor operations of the MRI scanner 12 and provide system adjustments in response, to improve the quality of the images produced. Of course, the field unit 38 may also communicate with the imaging scanner 12 via the network 32.

Figure 2:
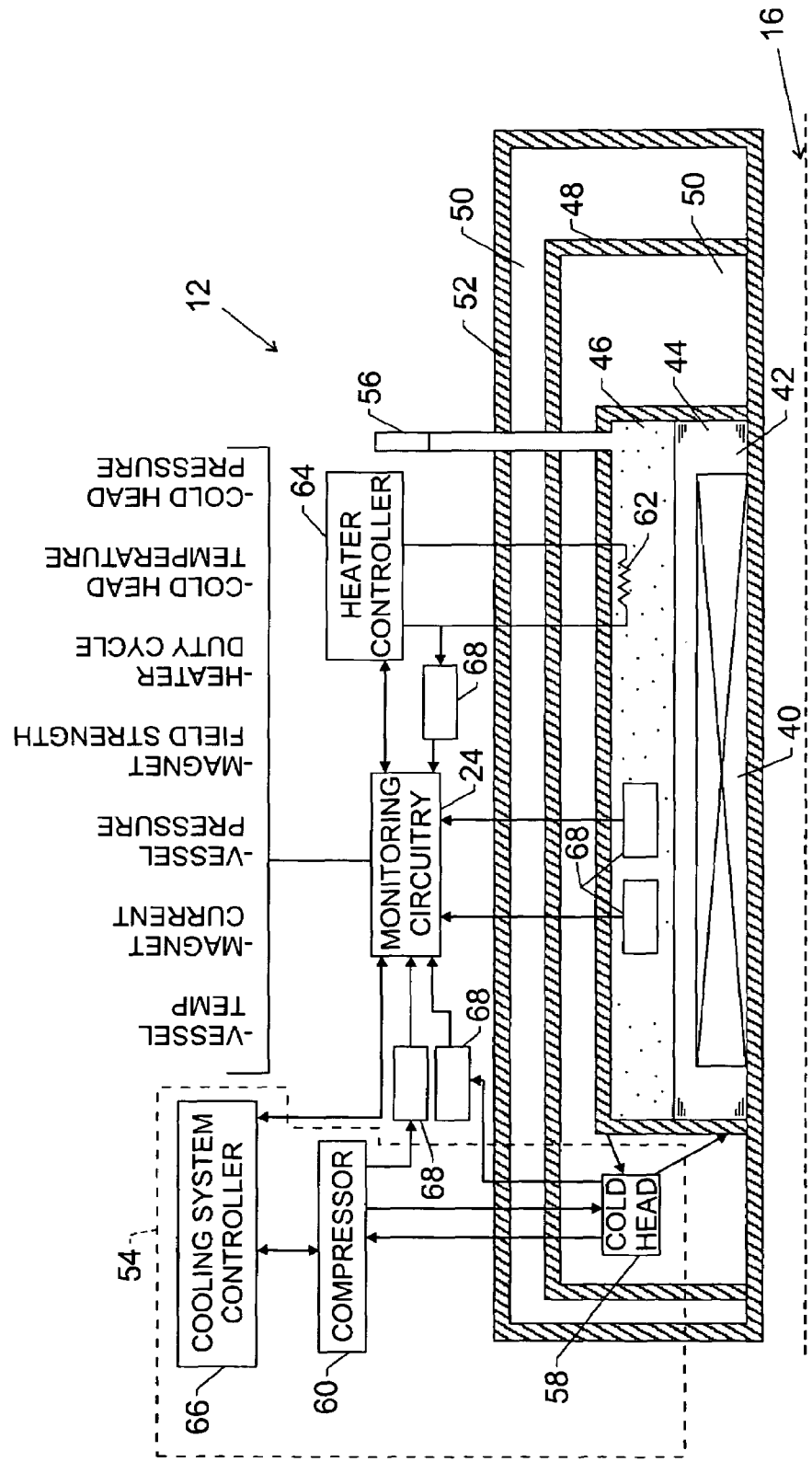
FIG. 2 is a partial cross-sectional view of an exemplary superconducting magnet of the type that may be brought into operation in accordance with the present technique.

Turning to FIG. 2, a partial cross-sectional view of an MRI scanner 12 is presented. Only an upper portion (i.e., above the centerline) of the exemplary, tubular MRI scanner 12 is illustrated. Because of the tubular design, the lower portion is similar to the upper portion, and, as such, the lower portion is not separately discussed. Additionally, it should be noted that, although a tubular scanner structure is described here, other geometries of magnets are known and presently in use, and can benefit from aspects of the present technique. For example, split imaging systems are known, in which an imaging volume is defined between two separated magnet sections. The sections are typically positioned either one above the other, or in a side-by-side arrangement. In either case, however, the superconductive magnet is cooled by a cryogenic system that may be maintained and serviced as described below. As discussed above, the MRI scanner 12 maintains a main magnetic field of approximately 0.5 to 2.0 Tesla in the patient bore 16. To produce the main magnetic field, the exemplary MRI scanner 12 includes a magnet 40 located towards the center of the MRI scanner 12 and disposed circumferentially about the patient bore 16. The main magnet is an electromagnet formed of loops of coiled wire. Routing electrical current through the coiled wire produces a magnetic field. To reduce the electrical load necessary to produce the desired main magnetic field, the exemplary electromagnet may be cooled to a superconductive state.

To transition the electromagnet to a superconductive state, the electromagnet 40 may be bathed in a cryogen, such as liquid helium 42, contained in a helium vessel 44, which circumscribes the patient bore 16 and surrounds the electromagnet 40. The liquid helium cools the electromagnet to superconductive temperatures (e.g., −269 C or 4 k). At superconductive temperatures, the electromagnet 40 (i.e., the loops of coiled wire) conducts electrical current essentially free of electrical resistance. Of course, the particular temperature at which the magnet materials transition to a superconducting state may vary depending upon the material used, and the specific temperature is not a limitation of the present technique. Advantageously, a relatively strong magnetic field (0.5-2.0 Tesla) may be produced at lesser electrical loads in comparison to traditional magnets, thereby reducing the operating costs of producing and maintaining the magnetic field. Other field strengths are, of course, possible, with spectroscopy and other systems obtaining significantly higher flux densities.

Liquid helium 42, similar to other cryogens, vaporizes into a gaseous state (i.e., gaseous helium 46) at relatively low temperatures (e.g., liquid helium boils at 4.2 K under standard pressure conditions). Accordingly, to insulate the helium 42 and 46 from external heat sources, the helium vessel 44 may be surrounded by a radiation heat shield 48. Advantageously, a vacuum region 50 located between the helium vessel 44 and the heat shield 48, as well as between the heat shield 48 and an outer housing 52 of the MRI scanner 12 may further insulate the helium vessel 44 from external heat sources.

Furthermore, as also discussed below, the vaporization of the liquid helium 42 typically increases the pressure in the helium vessel 44. Accordingly, the helium vessel 44 may be coupled to a vent or relief valve 56. In the present embodiment, for example, if pressure in the helium vessel 44 reaches or exceeds a desired operating pressure (e.g., 4 psi), the vent may release excess helium 46 to relieve the pressure. However, because helium is relatively expensive, the venting of the helium is to be avoided.

To conserve helium, the helium vessel 44 is coupled to a cryogen condensing system 54, which recondenses gaseous helium 46 back into its liquid phase 42. In the exemplary MRI scanner 12, the cryogen condensing system 54 includes a cold head 58 coupled to a compressor 60. As appreciated by those skilled in the art, the compressor 60 pressurizes a coolant, such as liquid nitrogen, and circulates the coolant to the cold head 58. By allowing the coolant to decrease in pressure, fins (not shown) in the cold head 58 may be cooled to the condensation point of the cryogen, that is, a low enough to cause the gaseous helium 46, for example, to return to its liquid phase. In a cyclical manner, the gaseous helium 46 is routed from the vessel, in the cold head 58, and across the fins. The fins, which are to cooled to approximately 2-4K, condense the helium into its liquid phase, and the recondensed liquid helium 42 is routed back into the helium vessel 44, thereby conserving the helium in the vessel 44 and producing equilibrium between the liquid and gaseous phases of the helium.

During operation of the MRI scanner 12, it may be advantageous to maintain the pressure within the helium vessel 44 within predetermined parameters, e.g., 4.0 to 4.5 psi. However, if, for example, the equilibrium in the helium vessel 44 is biased towards the liquid phase of the helium by the cold head 58, the helium vessel 44 may reach a negative pressure condition allowing atmospheric gases to be drawn into the vessel 44. If atmospheric gases enter the helium vessel 44, water vapor in the atmosphere may freeze, causing clogs in the cryogenic cooling system that degrade the performance and, in certain instances, leading to the failure of the condensing system 54 and/or the MRI scanner 12. Thus, to increase the pressure (i.e., increase the pressure to a positive pressure condition), a heating element 62, such as a resistive heating element, is located in the helium vessel 44. As discussed further below, while the cold head 58 operates substantially continuously, power to the heating element 62 cycles to maintain equilibrium within the vessel 44. The operating periods of the heating element 62 may be referred to as the heater duty cycle. In a present embodiment, power to the heating element 62 is controlled in a closed-loop manner based upon pressure detected within the vessel, to maintain the pressure between desired minimum and maximum levels.

Alternatively, if, for example, the equilibrium is biased towards the gaseous phase by the cold head 58 operating inefficiently or by external heat sources, the pressure in the vessel 44 may increase, leading to an undesired venting of helium and/or degradation in image quality. As discussed further below, if a high-pressure condition is detected, a cooling system controller 66 may optimize and adjust operations of the cooling system 54 to bias the equilibrium of the helium towards the liquid phase, thereby reducing the pressure in the vessel 44.

To monitor operation of the MRI scanner 12, a plurality of sensors 68 may be located throughout the MRI scanner 12, and particularly on or in the main magnet structures and support systems. For example, sensors for measuring cryogen temperature, pressure, and level may be located in the helium vessel 44 and are collectively indicated generally by reference numeral 68. Other sensors 68 may monitor shield temperatures, the magnet field strength and frequency (i.e., with a Tesla meter probe inserted into the magnet bore), magnet current, and operating variables of the condensing system 54, such as operating pressure and temperature of the cold head 58 and the compressor 60. Yet other sensors 68 may monitor the pressure control circuit and heating system, such as operation of the heater controller and heating element 62. Of course, there may be any number of sensors 68 located throughout the MRI scanner 12 for monitoring any number of conditions.

The various sensors 68 throughout the system may provide operational data regarding the MRI scanner 12 to the monitoring circuitry 24. Moreover, the heater controller and the cooling system controller may also provide data to the monitoring circuitry 24. By way of example, the monitoring circuitry 24 may receive and process data regarding the temperature within the vessel, the pressure within the vessel, the heater duty cycle, coolant pressure within the cooling system, or a host of any other operating conditions regarding the MRI scanner. Advantageously, the monitoring circuitry 24 may be configured to communicate the processed and received information to the network 32 as well as to the user interface 28 (see FIG. 1).

From time to time, the MRI scanner 12 may require maintenance. For example, the cold head 58 may begin to lose efficacy, the imaging coils may require calibration, the image quality may deteriorate, filters may require cleaning, to name but a few types of service maintenance. Moreover, the helium 44 may decline to undesirable levels and/or may reach undesirable temperatures, at which the magnet 40 may lose superconductivity. Accordingly, as mentioned above, servicing of these systems of the MRI scanner 12 may be required. Service maintenance, however, may require taking the MRI scanner 12 offline. Additionally, the MRI scanner 12 may require routine maintenance, such as calibration and testing, to sustain effective operations. Routine maintenance is typically conducted at predetermined intervals. Routine maintenance, too, may require taking the MRI scanner 12 and magnet offline. Indeed, as previously discussed, deactivation of the magnet is be minimized, in part, because of the subsequent ramp-up that may be required.

Figure 3:
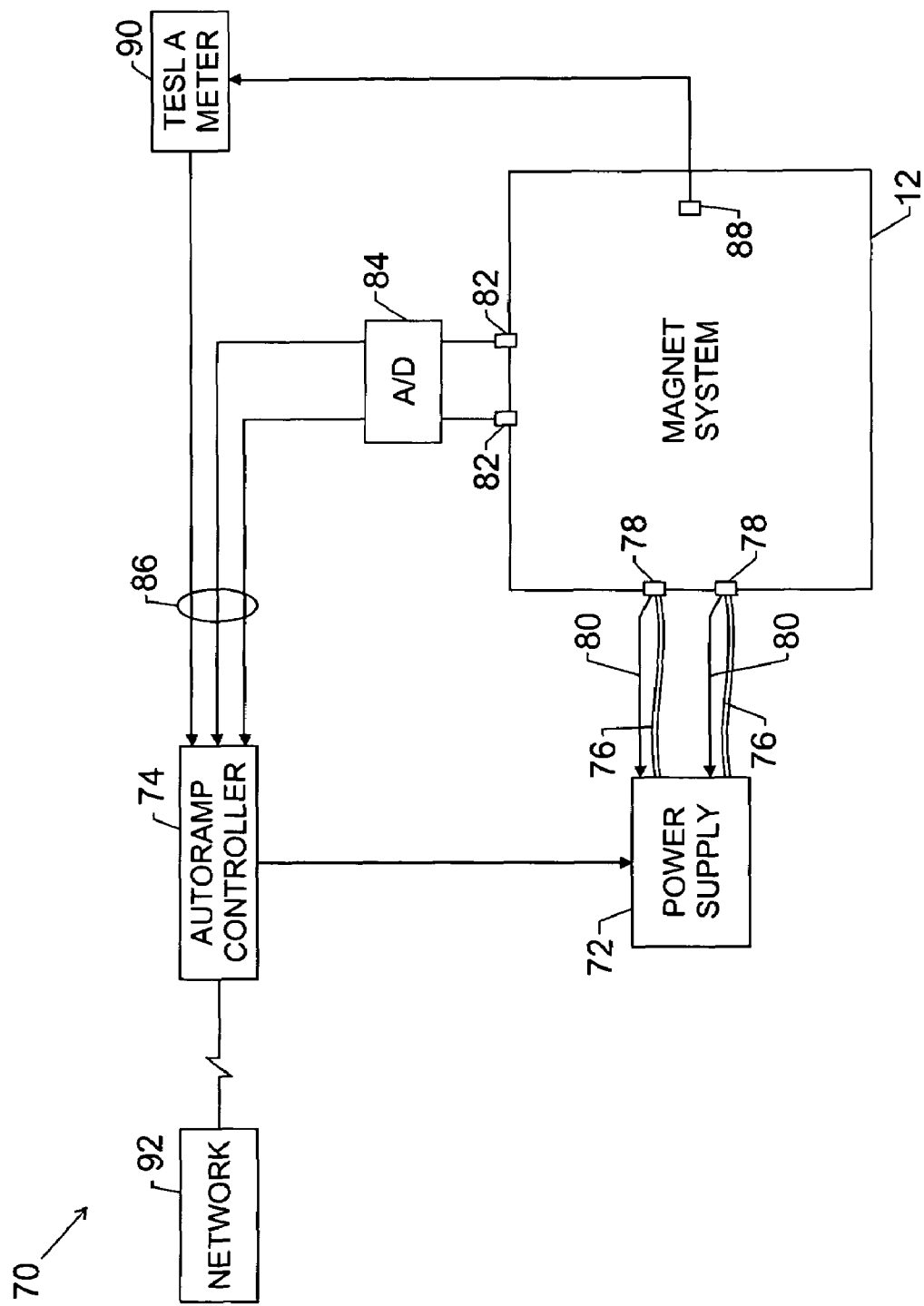
FIG. 3 is diagrammatical representation of an automatic ramping system for ramping-up a superconducting magnet system.

FIG. 3 is diagrammatical representation of an automatic ramping system 70 for ramping-up a superconducting magnet system 12. A power supply 72 controlled by an autoramp controller 74 is used to ramp-up current to the magnet system 12. The power supply 72 may be any suitable device commercially available, such as a Hewlett-Packard Agilent model 6030A. The power supply serves to supply current via charge lines 76, which terminate at terminals 78 on the magnet system 12. Sense lines 76 provide signals back to the power supply 72 for measuring the level of current in the magnet system 12. Alternate configurations are, of course, possible, such as an arrangement in which transducers at the terminals 78 determine current to the magnet, and product signals that are routed via the sense lines to the autoramp controller 74.

The autoramp controller 74 may provide a user interface and may be, for example, a workstation, general purpose computer, laptop, specialized control system, and the like. Temperature sensors 82 detect the temperature of magnet system 12, such as the magnet coil temperature, cryogen temperature, and/or radiation shield temperature, and may generally correspond the generic sensors 68 of FIG. 2. The temperature sensors 82 may include resistance temperature detectors (RTD's), thermocouples, and the like. In this example, the analog signals from temperature sensors 82 are routed through an analog-to-digital converter 84, and the converted digital signals may then be, for example, routed through a general purpose interface bus (GPIB) 86 to the autoramp controller 74. Though a GPIB, a widely used IEEE 488 standard, is mentioned, a variety of interfaces may be used with the autoramp controller 74. Furthermore, a Tesla meter probe 88 may be installed in the magnet system to measure the field strength in Tesla or Maxwells and the frequency in megahertz (mHz). A Tesla meter 90 receives a signal from probe 88 to read, for example, the frequency of the magnet field. The autoramp controller 74 receives a corresponding processed signal from the Tesla Meter 90, in this embodiment, via the GPIB 86.

The autoramp controller 74 may use one or more of the data measurements gathered via the aforementioned sensors to control the ramping-up of the magnet system 12. For example, the autoramp controller may use the magnet current measured with sense lines 80, whether the sense lines 80 are routed to the power supply or routed directly to the autoramp controller 74, as a constraining parameter, control variable, for switching, and so forth. The autoramp controller 74 may also utilize temperature, received from temperature sensors 82, or the frequency and/or field strength received from the Tesla meter 90. Finally, the autoramp controller 74 may be connected to a network 92, for example, via Ethernet, broadband, and the like. In this illustrative embodiment, information may be exchanged in either direction between autoramp controller 74 and network 92. Moreover the ramp-up of the superconducting magnet system 12 may be controlled remotely with network 92, though a currently preferred technique is to locally control the magnet ramp.

Figure 4:
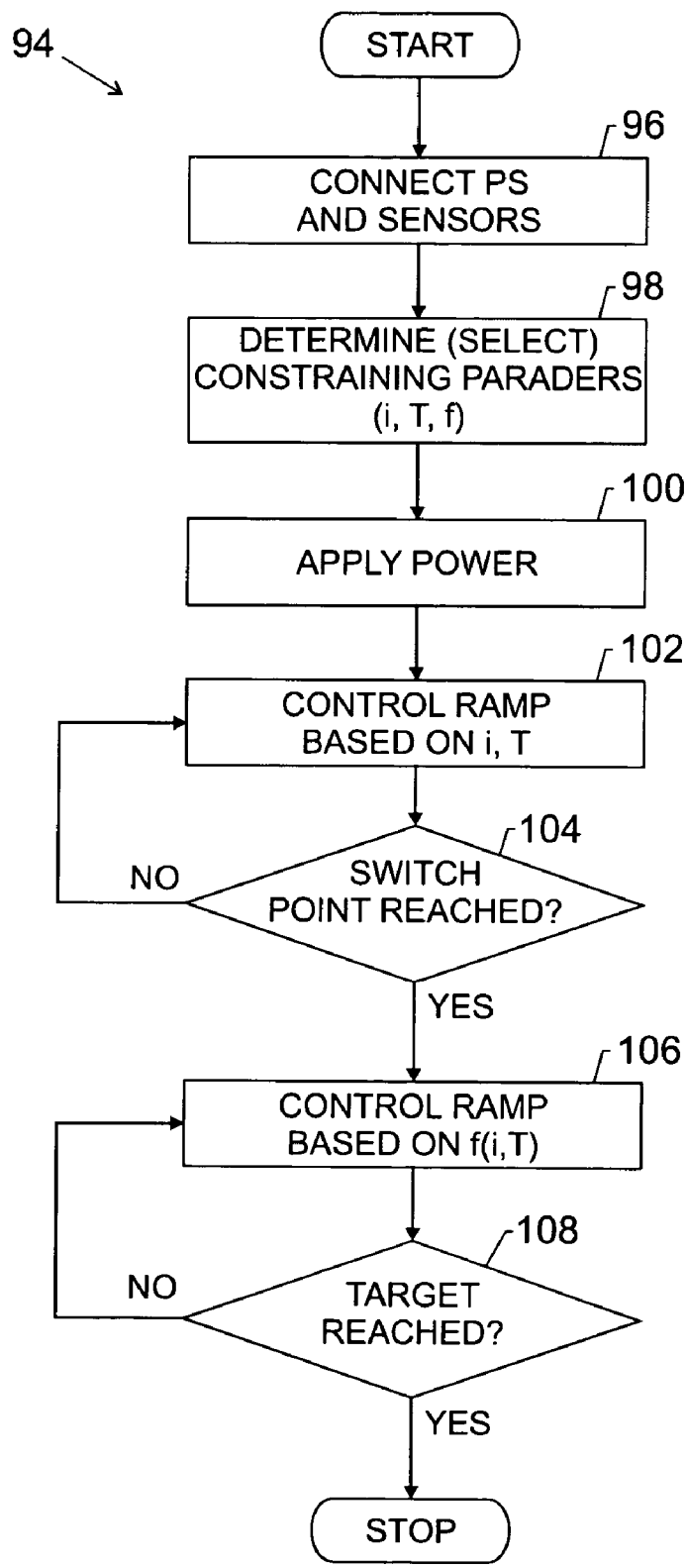
FIG. 4 is a block diagram of a magnet ramp-up method in accordance with the present technique.

FIG. 4 is a block diagram of an exemplary magnet ramping method 94. First, the power supply 72 is connected to the magnet system 12, as represented at block 96. As mentioned above, the sense lines for the power supply may be connected either to the power supply or directly to the autoramp controller 74, or through the GPIB 86 to the autoramp controller 74. The various sensors and/or their leads may also be connected to the autoramp controller 74, for example, through the GPIB 86. In general, the sensors discussed above provide data representative of the current in the magnet system 12, the temperature of the magnet system, and the field strength and/or frequency of the magnet system 12. As will be appreciated by those skilled in the art, in practice, the field strength of the magnet system and its frequency are co-variables, such that in the present ramp-up technique the field strength may be sensed and used as a controlling or constraining parameter as an indication of the desired target frequency.

A user or the system may determine which parameters, such as current, temperature, and frequency, may constrain the automatic ramping of the system as indicated at block 98. In general, the present technique improves and time optimizes ramp-up by employing multiple parameters for control of the ramp rate, as discussed below. Power is applied to the magnet system 12 from the power supply 72 as indicated at block 100, and may be constrained, for example, in the range of 1-4 amperes per minute. An initial load of current may be applied to the magnet coils, and then additional current ramped, for example, at a rate of 1-2 amperes per minute. The power supply 72 meter may read the increasing amount of current in the magnet as the ramp-up progresses. In one example, the final magnet current at completion of the ramp is 57 amperes.

In a present embodiment, the initial constraining parameters include current and temperature, as indicated at block 102. During the first phase of the ramp-up procedure, the ramp-up rate in amperes per minute may be controlled based on magnet current and magnet temperature. The autoramp controller 74, for example, may add one to two amperes per minute until reaching a specified magnet current, while preventing the magnet temperature from exceeding a predetermined value, such as 7K. During this first phase, the ramp-up may progress at a constant voltage and generally constant current.

In accordance with one aspect of the present technique, when a predetermined switch point is reached, it has been found to be beneficial to transition to a second phase of control of the magnet automatic ramp-up process. During a second or later phase of ramp-up, the autoramp controller 74 may employ different control variables than in the first phase, such as the frequency and field strength, in conjunction with temperature as an overall constraining parameter. In one example, the switch point, indicated at block 104, generally corresponds to a point when feedback from the Tesla meter reading becomes substantially stable and/or when the magnet current reaches 35-40 amperes. In this illustrative example, before reaching the switch point, the autoramp controller will continue to control based on current and temperature. Once the switch point is reached, such as the exemplary magnet current of 40 amperes, the autoramp controller 74 transitions to the second phase of ramp-up control. In this embodiment, the second phase of control is based on the frequency, or on the magnetic field strength. In a present embodiment, the ramp-up process has an ultimate target frequency of 15.0002 MHz, which corresponds a magnetic field strength of approximately 0.35 Tesla. Control enters this second phase, designated by reference numeral 106, upon reaching the aforementioned switching point, for example, when the current level in the magnet system 12 reaches 35-40 amperes.

During the first phase of ramp-up, the one to two ampere per minute ramp rate may be adjusted, for example, according to the temperature of the magnet. If the temperature increases excessively (e.g., exceeding 7 K), the autoramp controller 74 may decrease the ampere ramp rate. In the present exemplary embodiment, as noted above, once the switching point is reached (e.g., magnet current of 35-40 amperes), the autoramp controller switches to control based on the frequency of the magnet field. In general, the autoramp controller 74 may gradually reduce the ramp-up rate as the magnetic field strength reaches or approaches the target field strength, as an indication of the magnet frequency, with an exemplary target frequency set at 15.0002 MHz in the exemplary implementation. The autoramp controller 74 continues the ramp-up of the magnet current through this second phase, adding current until the target frequency (or field strength) is reached, as indicated at block 108. Once the target frequency is reached the ramp-up of the magnet 12 is complete. At the completion of the ramp-up the coils may then be closed, such as via a read switch or persistence switch. Thereafter, the current in the coils circulates without any external power supply and theoretically will continue indefinitely. It should be noted that the same power supply 72 may also be used to ramp-down to drain or deplete the magnet system current. A particularly powerful aspect of the present technique is the relatively faster ramp times. For example, in the illustrated magnet system 12, manual ramp times in the range of 55 to 90 minutes are reduced to approximately 50 minutes. Such reductions in ramp-up time are realized by maintaining ramp-up rates constrained by multiple parameters, including current, temperature and field strength (or frequency). Moreover, the present technique reduces the occurrence of overshoot of the target current by altering the ramp-up rate during the second phase of ramp-up.

Figure 5:
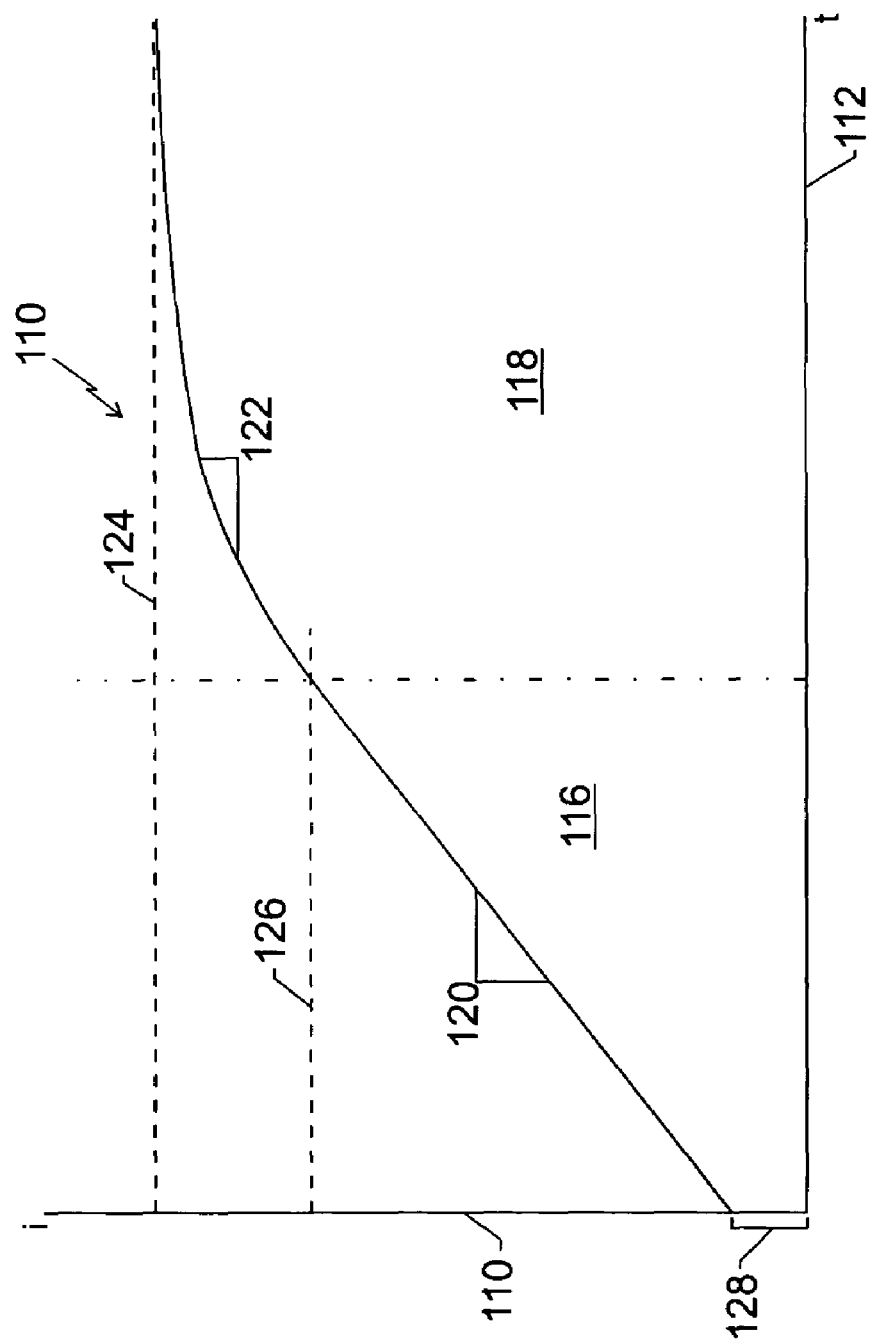
FIG. 5 is a diagrammatical representation of a magnet current trace as a plot of magnet current versus time during a ramp-up procedure implemented as set forth in as summarized in FIG. 4.

FIG. 5 is a graphical representation of a magnet current trace 108 as a plot of magnet current 110 versus time 112. In general, the magnet current trace 108 is a graphical representation of an exemplary automatic ramping of the magnet system 12, the automatic ramp having a first phase 114 and a second phase 116. The current trace 108 is shown with an increasing slope 118 during the first phase 114 of ramp-up, during which time the current ramp-up rate is substantially linear in the illustrated example (i.e., constant voltage and constant current). Non-linearities may, of course, be introduced, such as when temperature other constraints are reached. Moreover, the ramp rate 118 during the first phase may experience step changes and thus, may have several linear slopes during the first phase 114, or the automatic control may incorporate, for example, proportional-integral or proportional-integral-differential control of the current.

The ramp rate 120 or slope of the trace 108 during the second phase 116 is shown as substantially non-linear. In this example, the autoramp controller gradually reduces the standard 1-2 amperes per minute ramp rate as the ramp-up nears the target magnet current 122 (e.g., 55 A) corresponding to the desired frequency (e.g., 15.0002 mHz) or field strength (e.g., 0.35 Tesla). The actual target variables and values may, of course, depend upon the type of superconducting magnet system. For example, as will appreciated by those skilled in the art, unshielded magnets (without ferrite blocks) generally require more current than shielded magnets (with ferrite blocks) to maintain the same field strength.

Additionally, in the exemplary embodiment described herein, the control of the ramping transitions from the first phase 114 to the second phase 116 when the feedback signals received from Tesla meter become stable (e.g. at 40 A). The location of the switching point between the first phase and second phase of ramp-up is denoted by reference numeral 124. As previously indicated, the constraining parameters in the automatic ramp-up of the magnet system 112 may change from the first phase 114 to the second phase 116. It should be emphasized that a variety of variables and values other than magnet current at 40 amperes may be used to determine the switching point from the first phase to the second phase of ramp-up. Finally, reference numeral 126 denotes the initial load that may be placed on the magnet system 12, which may be zero or greater, depending on, for example, the magnet system.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method for automatically controlling ramp-up of a superconducting magnet, comprising:
   connecting a power supply to the superconducting magnet;
   determining constraining parameters of the ramp-up, wherein constraining parameters comprise magnet current during a first phase of the ramp-up and comprise magnet frequency or field strength during a second phase of the ramp-up;
   applying power to the superconducting magnet;
   automatically controlling the ramp-up based on the constraining parameters, wherein a switching point specifies when constraining parameters change between the first phase and second phase; and
   continuing ramp-up until a predetermined value of a target parameter is reached.

2. The method of claim 1, comprising automatically controlling a rate of supply current to the magnet based on the constraining parameters, and wherein the target parameter comprises magnet frequency or field strength, and the constraining parameters include magnet current and magnet temperature.

3. The method of claim 2, comprising:
   measuring operating values of the constraining parameters; and
   comparing the operating values with set points of the constraining parameters to control the rate of supply current.

4. The method of claim 2, comprising:
   measuring magnet temperature, current applied to the magnet, and magnet field strength continuously during the ramp-up process.

5. The method of claim 1, wherein constraining parameters during the first phase and second phase comprise magnet temperature.

6. The method of claim 5, wherein magnet temperature comprises magnet coil temperature, cryogen temperature, or radiation shield temperature, such magnet temperature controlled to remain less than about 7 K, and a total increase in magnet temperature over the ramp-up is controlled to remain at less than about 2 K.

7. The method of claim 5, comprising controlling the rate of supply current in the range of 0 to 4 amperes per minute.

8. The method of claim 1, wherein the switching point is reached when a field strength of the magnet system becomes stable.

9. The method of claim 1, wherein the switching point comprises a magnet current in the range of 35-40 amperes.

10. The method of claim 2, wherein the predetermined value of the target parameter is a magnet frequency of about 15.0002 megahertz.

11. A method for automatically controlling a ramp-up of a superconducting magnet, comprising:
applying power to the magnet constrained by a target current ramp-up rate and magnet temperature during a first phase of ramp-up;
applying power to the magnet constrained by a target magnetic field strength or frequency and by magnet temperature during a second phase of ramp-up, wherein transition from the first phase to the second phase occurs automatically without operator intervention; and
terminating application of power to the magnet upon reaching a target magnetic field strength or frequency.

12. The method of claim 11, comprising measuring magnet temperature, current applied to the magnet, and magnetic field strength continuously during ramp-up.

13. The method of claim 11, comprising automatically controlling ramp-up such that the magnet temperature does not exceed a maximum value.

14. The method of claim 13, wherein the maximum value is about 7.2 K.

15. The method of claim 11, wherein ramp-up is primarily current-limited during the first phase of ramp-up and magnetic field strength-limited during the second phase of the ramp-up, and wherein a switching parameter value defines a transition point between the first phase and second phase.

16. The method of claim 15, wherein the target frequency is approximately 15.0002 MHz or the target magnetic field strength is approximately 0.35 Tesla.

17. The method of claim 15, wherein the switching parameter value is in the range of 35-40 amperes of magnet current.

18. The method of claim 15, wherein power is applied at an initial level of approximately 2.2 volts at approximately 15 amperes for the first phase of ramp-up.

19. The method of claim 15, wherein power is applied during the first phase of ramp-up at a generally constant voltage and a generally constant current.

20. A system for automatically ramping a superconducting magnet, comprising:
an autoramp controller coupled to a power supply and configured to control a automatic ramp of the magnet;
the power supply coupled via charge lines to the magnet for supplying current to the magnet;
the power supply coupled via sense lines to the magnet for measuring magnet current;
one or more magnet temperature sensors coupled via an analog-to-digital converter to the autoramp controller for measuring magnet temperature; and
a magnet field strength or frequency sensor coupled via a meter to the autoramp controller for measuring magnet field strength or frequency.

21. The system of claim 20, wherein the autoramp controller is coupled via sense lines to transducers disposed at terminals on the magnet to measure magnet current.

22. The system of claim 20, wherein the meter for measuring magnet field strength or frequency is a Tesla meter, and the magnet field strength or frequency sensor is a Tesla meter probe inserted into the magnet bore.

23. The system of claim 20, comprising:
a general purpose interface bus (GPIB) configured to receive digital signals from the analog-to-digital converter for the magnet temperature sensors and from the meter for the magnet field strength or frequency sensor; and
wherein the GPIB provides the digital signals to the autoramp controller.

24. The system of claim 23, wherein the autoramp controller comprises a general purpose computer or a laptop computer.

25. A superconducting magnet system, comprising:
one or more magnets;
a cryogen vessel disposed in the superconducting magnet system and holding a cryogen for cooling the one or more magnets;
an autoramp controller coupled to a power supply and configured to control a automatic ramp of the magnet;
the power supply connected via charge lines to the magnet for providing current to the magnet;
the power supply connected via sense lines to the magnet for reading magnet current;
one or more magnet temperature sensors for measuring magnet temperature coupled via an analog-to-digital converter to the autoramp controller; and
a magnet field strength or frequency sensor for measuring magnet field strength or frequency coupled via a meter to the autoramp controller.

26. The system of claim 25, wherein the meter for measuring magnet field strength or frequency is a Tesla meter, and the magnet field strength or frequency sensor is a Tesla meter probe inserted into the magnet bore.

27. The system of claim 25, comprising:
a general purpose interface bus (GPIB) configured to receive digital signals from the analog-to-digital converter for the magnet temperature sensors and from the meter for the magnet field strength or frequency sensor; and
wherein the GPIB provides the digital signals to the autoramp controller.

28. The system of claim 25, comprising:
a cold head configured for removing heat from the superconducting magnet and condensing cryogen vapor received from a vapor space of the cryogen vessel;
a refrigerant compressor system that supplies refrigerant to the cold head to cool the cold head;
a heater for vaporizing cryogen liquid and controlling pressure in the cryogen vessel; and
a relief vent disposed in the superconducting magnet system for relieving cryogen from the cryogen vessel.

29. The system of claim 28, wherein the superconducting magnet system is disposed within a magnetic resonance (MR) imaging system.

30. The system of claim 28, wherein the cryogen comprises helium.

31. A system for automatically controlling ramp-up of a superconducting magnet, comprising:
means for connecting a power supply to the magnet;
means for determining constraining parameters of the ramp-up, wherein constraining parameters comprise magnet current and temperature during a first phase of the ramp-up and comprise magnet frequency or field strength and temperature during a second phase of the ramp-up;

means for applying power to the magnet;

means for automatically controlling the ramp-up based on the constraining parameters, wherein a switching point specifies when constraining parameters change between the first phase and second phase; and means for continuing ramp-up until a predetermined value of a target parameter is reached.

32. The system of claim 31, comprising means for automatically controlling a rate of supply current to the magnet based on the constraining parameters, and wherein the target parameter comprises magnet frequency or field strength.

33. The system of claim 32, comprising:

means for measuring operating values of the constraining parameters; and means for comparing the operating values with set points of the constraining parameters to control the rate of supply current.

34. The system of claim 32, comprising:

means for measuring magnet temperature, current applied to the magnet, and magnet field strength continuously during the ramp-up process.

35. The system of claim 34, wherein constraining parameters during the first phase and second phase comprise magnet temperature.

36. The system of claim 35, wherein magnet temperature comprises magnet coil temperature, cryogen temperature, or radiation shield temperature, such magnet temperature controlled to remain less than about 7 K, and a total increase in magnet temperature over the ramp-up is controlled to remain at less than about 2 K.

37. The system of claim 35, comprising means for controlling the rate of supply current in the range of 0 to 4 amperes per minute.

38. The system of claim 31, wherein the switching point is reached when a field strength of the magnet system becomes stable.

39. The system of claim 31, wherein the switching point comprises a magnet current in the range of 35-40 amperes.

40. The system of claim 31, wherein the predetermined value of the target parameter is a magnet frequency of about 15.0002 megahertz.

41. A system for automatically controlling a ramp-up of a superconducting magnet, comprising:

means for applying power to the magnet constrained by a target current ramp-up rate and magnet temperature during a first phase of ramp-up;

means for applying power to the magnet constrained by a target magnetic field strength or frequency and by magnet temperature during a second phase of ramp-up, wherein transition from the first phase to the second phase occurs automatically without operator intervention; and means for terminating application of power to the magnet upon reaching a target magnetic field strength or frequency.

42. The system of claim 41, comprising means for measuring magnet temperature, current applied to the magnet, and magnetic field strength continuously during ramp-up.

43. The system of claim 41, comprising means for automatically controlling ramp-up such that the magnet temperature does not exceed a maximum value.

44. The system of claim 43, wherein the maximum value is about 7.2 K.

45. The system of claim 41, wherein ramp-up is primarily current-limited during the first phase of ramp-up and magnetic field strength-limited during the second phase of the ramp-up, and wherein a switching parameter value defines a transition point between the first phase and second phase.

46. The system of claim 45, wherein the target frequency is approximately 15.0002 MHz or the target magnetic field strength is approximately 0.32 Tesla.

47. The system of claim 45, wherein the switching parameter value is in the range of 35-40 amperes of magnet current.

48. The system of claim 45, wherein power is applied at an initial level of approximately 2.2 volts at approximately 15 amperes for the first phase of ramp-up.

49. The system of claim 45, wherein power is applied during the first phase of ramp-up at a generally constant voltage and a generally constant current.

* * * * *